(12) United States Patent
Tang et al.

(10) Patent No.: US 10,784,388 B2
(45) Date of Patent: Sep. 22, 2020

(54) PHOTOVOLTAIC DEVICES WITH DEPLETED HETEROJUNCTIONS AND SHELL-PASSIVATED NANOPARTICLES

(71) Applicant: THE GOVERNING COUNCIL OF THE UNIVERSITY OF TORONTO, Toronto (CA)

(72) Inventors: Jiang Tang, Toronto (CA); Andras Pattantyus-Abraham, Burnaby (CA); Illan Kramer, Toronto (CA); Aaron Barkhouse, Yorktown Heights, NY (US); Xihua Wang, Toronto (CA); Gerasimos Konstantatos, Barcelona (ES); Ratan Debnath, Toronto (CA); Edward H. Sargent, Toronto (CA)

(73) Assignee: THE GOVERNING COUNCIL OF THE UNIVERSITY OF TORONTO, Toronto (CA)

( * ) Notice: Subject to any disclaimer, the term of this patent is extended or adjusted under 35 U.S.C. 154(b) by 0 days.

(21) Appl. No.: 15/192,361

(22) Filed: Jun. 24, 2016

(65) Prior Publication Data

US 2016/0372616 A1    Dec. 22, 2016

Related U.S. Application Data

(62) Division of application No. 12/890,797, filed on Sep. 27, 2010, now Pat. No. 9,382,474.

(Continued)

(51) Int. Cl.
*H01L 31/0352*   (2006.01)
*C09K 11/66*   (2006.01)
(Continued)

(52) U.S. Cl.
CPC .... *H01L 31/035218* (2013.01); *C09K 11/661* (2013.01); *C09K 11/662* (2013.01);
(Continued)

(58) Field of Classification Search
None
See application file for complete search history.

(56) References Cited

U.S. PATENT DOCUMENTS 6,198,092 B1    3/2001   Bulovic et al.
8,524,365 B2    9/2013   O'Brien et al.
(Continued)

FOREIGN PATENT DOCUMENTS

CN    101400512    4/2009
EP    1176646    1/2002
(Continued)

OTHER PUBLICATIONS

Xie et al., Synthesis and characterization of highly luminescent CdSe-core CdS/Zn0.5Cd0.5S/ZnS multishell nanocrystals; JACS 2005 127 7480-7488 (Year: 2005).*

(Continued)

*Primary Examiner* — Shannon M Gardner
(74) *Attorney, Agent, or Firm* — Kilpatrick Townsend & Stockton LLP

(57) ABSTRACT

Photovoltaic cells are fabricated in which the compositions of the light-absorbing layer and the electron-accepting layer are selected such that at least one side of the junction between these two layers is substantially depleted of charge carriers, i.e., both free electrons and free holes, in the absence of solar illumination. In further aspects of the invention, the light-absorbing layer is comprised of dual-shell passivated quantum dots, each having a quantum dot core with surface anions, an inner shell containing cations to passivate the core surface anions, and an outer shell to (Continued)

passivate the inner shell anions and anions on the core surface.

18 Claims, 4 Drawing Sheets

Related U.S. Application Data

(60) Provisional application No. 61/321,450, filed on Apr. 6, 2010, provisional application No. 61/334,650, filed on May 14, 2010.

(51) Int. Cl.

| | | |
|---|---|---|
| *H01L 31/032* | (2006.01) | |
| *H01L 31/072* | (2012.01) | |
| *H01L 31/0224* | (2006.01) | |
| *H01L 31/0296* | (2006.01) | |
| *H01L 31/18* | (2006.01) | |
| *B82Y 20/00* | (2011.01) | |
| *B82Y 40/00* | (2011.01) | |

(52) U.S. Cl.
CPC .. *H01L 31/0296* (2013.01); *H01L 31/022466* (2013.01); *H01L 31/0324* (2013.01); *H01L 31/0352* (2013.01); *H01L 31/072* (2013.01); *H01L 31/1868* (2013.01); *B82Y 20/00* (2013.01); *B82Y 40/00* (2013.01); *Y02E 10/50* (2013.01); *Y10S 977/774* (2013.01); *Y10S 977/892* (2013.01); *Y10S 977/948* (2013.01)

(56) References Cited

U.S. PATENT DOCUMENTS

| | | | |
|---|---|---|---|
| 9,382,474 | B2 | 7/2016 | Tang et al. |
| 2002/0017656 | A1 | 2/2002 | Graetzel et al. |
| 2005/0126628 | A1 | 6/2005 | Scher et al. |
| 2005/0155641 | A1 | 7/2005 | Fafard |
| 2007/0025139 | A1 | 2/2007 | Parsons |
| 2007/0049047 | A1 | 3/2007 | Fujimoto et al. |
| 2007/0151597 | A1 | 7/2007 | Chen et al. |
| 2007/0289623 | A1 | 12/2007 | Atwater |
| 2008/0066802 | A1 | 3/2008 | Reddy |
| 2008/0216891 | A1 | 9/2008 | Harkness et al. |
| 2008/0252209 | A1 | 10/2008 | Jang et al. |
| 2009/0230382 | A1* | 9/2009 | Banin .............. B82Y 20/00 257/14 |

FOREIGN PATENT DOCUMENTS

| | | |
|---|---|---|
| JP | 2002111031 | 4/2002 |
| JP | 2005159168 | 6/2005 |
| JP | 2006501640 | 1/2006 |
| JP | 2006286902 | 10/2006 |
| JP | 2007537886 | 12/2007 |
| JP | 2009537994 | 10/2009 |
| JP | 2011518421 | 6/2011 |
| JP | 5586948 | 8/2014 |
| JP | 6360130 | 6/2018 |
| KR | 100841186 | 6/2008 |
| KR | 1020100027016 | 3/2010 |
| TW | I273719 | 2/2007 |
| WO | 2004017427 | 2/2004 |
| WO | WO-2004066361 A2 * | 8/2004 .............. B82Y 15/00 |
| WO | 2007134222 | 11/2007 |
| WO | 2009026141 | 2/2009 |
| WO | 2009074993 | 6/2009 |
| WO | 2010018490 | 2/2010 |

OTHER PUBLICATIONS

U.S. Appl. No. 12/890,797, Advisory Action dated Sep. 26, 2014, 3 pages.
U.S. Appl. No. 12/890,797, Final Office Action dated Jul. 8, 2014, 14 pages.
U.S. Appl. No. 12/890,797, Non-Final Office Action dated Nov. 23, 2015, 12 pages.
U.S. Appl. No. 12/890,797, Non-Final Office Action dated Dec. 18, 2013, 13 pages.
U.S. Appl. No. 12/890,797, Non-Final Office Action dated Mar. 27, 2015, 14 pages.
U.S. Appl. No. 12/890,797, Notice of Allowance dated Mar. 9, 2016, 7 pages.
U.S. Appl. No. 12/890,797, Notice of Allowance dated Aug. 17, 2015, 8 pages.
Chinese Application No. 201180017884.6, Office Action dated Aug. 20, 2015, 11 pages.
European Application No. 11711741.6, Office Action dated Mar. 21, 2014, 10 pages.
European Application No. 11711741.6, Office Action dated Feb. 26, 2015, 5 pages.
Fernee et al., Inorganic surface passivation of PbS nanocrystals resulting in strong photoluminescent emission, Nanotechnology, vol. 14, No. 9, Sep. 1, 2003, pp. 991-997.
Ghosh et al., Core-Shell Nanoparticles: An Approach to Enhance Electrical Bistability, Journal of Physical Chemistry C, vol. 112, No. 30, Jul. 31, 2008, pp. 11290-11294.
Gimenez et al., Improving the performance of colloidal quantum-dot-sensitized solar cells, Nanotechnology, vol. 20, 2009.
Hillhouse et al., Solar cells from colloidal nanocrystals: Fundamentals materials, devices, and economics, Current Opinion In Colloid and Interface Science, vol. 14, No. 4, Aug. 1, 2009, pp. 245-259.
Japanese Application No. 2013-503781, Office Action dated Aug. 4, 2015, 7 pages (3 pages for the original document and 4 pages for the English translation).
Japanese Application No. 2013-503781, Office Action dated Aug. 8, 2014, 7 pages (3 pages for the original document and 4 pages for the English translation).
Jun et al., Interfused semiconductor nanocrystals: brilliant blue photoluminescence and electroluminescence, Chemical Communications, No. 36, Jan. 1, 2005, pp. 4616-4618.
Kamat, Quantum Dot Solar Cells. Semiconductor Nanocrystals as Light Harvesters, Journal of Physical Chemistry C, vol. 112, No. 48, Oct. 18, 2008, pp. 18737-18753.
Larramona et al., Nanostructured Photovoltaic Cell of the Type Titanium Dioxide, Cadmium Sulfide Thin Coating, and Copper Thiocyanate Showing High Quantum Efficiency, Chem.Mater., vol. 18, No. 6, 2006, pp. 1688-1696.
Lee et al., Multilayered Semiconductor (CdS/CdSe/ZnS)-Sensi Prepared by Successive Ionic Layer Adsorption and Reaction Processes, Chemistry of materials, vol. 22, No. 19, Sep. 8, 2010, pp. 5636-5643.
Leschkies et al., Solar cells based on Junctions between colloidal PbSe nanocrystals and thin ZnO films, ACS Nano, vol. 3, No. 11, Oct. 20, 2009, pp. 3638-3648.
*International Application No. PCT/US2011/030074, International Search Report and Written Opinion dated Jul. 22, 2011, 11 pages.
Yong et al., Shape Control of CdS Nanocrystals in One-Pot Synthesis, J. Phys. Chem. C, vol. 111, No. 6, Jan. 23, 2007, pp. 2447-2458.
Office Action dated May 10, 2017, issued in Korean Application No. 10-2012-7029025, 5 pages.
"Office Action" issued in Canadian application No. CA2,795,719, dated Nov. 14, 2017, 4 pages.
Fernee et al., "Inorganic Surface Passivation Of Pbs Nanocrystals Resulting In Strong Photoluminescent Emission", Nanotechnology, vol. 14, Issue 9, 2003, pp. 1-23.
"Office Action" issued in Korean application No. KR10-2012-7029025, dated Dec. 18, 2017, 4 pages.
Office Action issued in Canadian Application No. CA2,795,719, dated Feb. 21, 2017, 4 pages.
"Office Action" issued in Japanese Application No. JP 2016-225169, dated Jan. 9, 2018, 4 pages.
Talapin et al., "Cdse/Cds/Zns And Cdse/Znse/Zns Core-Shell-Shell Nanocrystals", Institute of Physical Chemistry, vol. 108, Issue 49, Nov. 12, 2004, pp. 18826-18831.

(56) References Cited

OTHER PUBLICATIONS

Chinese Application No. CN201610694633.6, "Office Action", dated Apr. 29, 2019, 6 pages.
Chinese Application No. CN201610694633.6, "Office Action", dated Jan. 10, 2020, 8 pages.

* cited by examiner

PHOTOVOLTAIC DEVICES WITH DEPLETED HETEROJUNCTIONS AND SHELL-PASSIVATED NANOPARTICLES

CROSS-REFERENCES TO RELATED APPLICATIONS

The present invention is a divisional application of U.S. patent application Ser. No. 12/890,797, filed Sep. 27, 2010, which claims the benefit of U.S. Provisional Patent Application No. 61/321,450, filed Apr. 6, 2010, and U.S. Provisional Patent Application No. 61/334,650, filed May 14, 2010. The entire contents and disclosure of these applications are hereby incorporated herein by reference.

BACKGROUND OF THE INVENTION

1. Field of the Invention

This invention resides in the fields of photovoltaic cells and quantum dots.

2. Description of the Prior Art

Solar cells that generate electricity through the photovoltaic effect require a combination of low cost and high efficiency in order for such cells to offer a practical alternative to traditional means of power generation. One way in which the cost of manufacturing a photovoltaic cell can be lowered is by the use of solution processing to form the layer of light-harvesting material that is part of the cell. The efficiency of the cell, however, depends on the cell materials, including the light-harvesting material. The optimal light-harvesting material is one that achieves a high short-circuit current density $J_{sc}$ by maximizing the absorption of the sun's rays in both the visible and infrared spectra, and one that extracts a high level of work, in the form of a high open-circuit voltage $V_{oc}$ and a high fill factor FF, from each absorbed photon. For an input solar intensity $P_{solar}$ (typically 100 mW cm$^{-2}$), the power conversion efficiency η is defined as $$\eta = \frac{V_{oc} J_{sc} FF}{P_{solar}}$$

It has been reported by Sargent, E., in "Infrared photovoltaics made by solution processing," *Nat. Photonics* 3, 325-331 (2009), and Hillhouse H. S., et al., in "Solar cells from colloidal nanocrystals: Fundamentals, materials, devices, and economics" *Curr. Opin. Colloid Interface Sci.* 14, 245-259 (2009), that the use of colloidal quantum dots as the light-harvesting material provides photovoltaic cells with high power conversion efficiencies. Colloidal quantum dot photovoltaics offer both the ability to form the light-harvesting layer by solution processing and the ability to tune the bandgap over a wide range, benefits that are available in both single-junction and multijunction cells. The ability to tune the bandgap also enables the use of inexpensive, abundant ultralow-bandgap semiconductors that are otherwise unsuitable for photovoltaic energy conversion. By combining lead chalcogenide quantum dots and Schottky junctions, photovoltaic cells with efficiencies of 3.4% have been achieved, as reported by Ma, W., et al., "Photovoltaic devices employing ternary PbS$_x$Se$_{1-x}$ Nanocrystals," *Nano Lett.* 9, 1699-1703 (2009), and others. Significant progress has also been achieved by sensitizing nanoporous TiO$_2$ electrodes with a thin layer of colloidal quantum dots, with power conversion efficiencies of 3.2%. See for example Fan, S., et al., "Highly efficient CdSe quantum-dot-sensitized TiO$_2$ photoelectrodes for solar cell applications," *Electrochem. Commun.* 11, 1337-1330 (2009).

Both colloidal quantum dots and Schottky devices pose certain limitations on photovoltaic efficiencies, however. In Schottky devices, both the $V_{oc}$ and the FF values have fallen well below their potential, and in cells sensitized by colloidal quantum dots, the $J_{sc}$ values are generally lower despite the increases in $V_{oc}$ and FF.

SUMMARY OF THE INVENTION

It has now been discovered that the limitations of colloidal quantum dot photovoltaics as noted above can be significantly reduced or overcome by the pairing of a layer of light-harvesting nanoparticles with a layer of an electron-accepting material such that the junction between these layers is substantially depleted of both free electrons and free holes on at least one side of the junction when the device is not illuminated. An effective means of achieving this depletion is by selecting materials for these two layers that are of different bandgap magnitudes. Such a junction is thus a heterojunction by virtue of the two different materials on either side of the junction, and in particular a depleted heterojunction by virtue of the low level or absence of both free electrons and free holes in the vicinity of the junction. The depletion arises from charge transfer from the electron-accepting contact to the to the nanoparticles. In certain embodiments of the invention, the nanoparticles are quantum dots, include p-type colloidal quantum dots, and the electron-accepting layer is, or includes, a metal oxide. The depletion is at least partly attributable to a relatively low charge density in the electron-accepting layer, as compared to that of the metal contact of a Schottky junction, which has a very high free electron density.

Particular embodiments of photovoltaic devices within the scope of this invention offer further advantages over photovoltaic devices of the prior art. For example, the use of a metal oxide as the electron-accepting layer allows the device to be configured with the electron-accepting layer as the front surface of the device or as the layer that the solar rays first penetrate upon entering the two semiconductor layers that form the photovoltaic junction. The electrons liberated by the rays are thus less susceptible to recombination with the holes since the electrons in these embodiments have a shorter distance to travel before reaching their destination electrode. Also, in embodiments in which the junction is that between a metal oxide and quantum dots, the junction is better defined and easier to passivate, and thus less susceptible to defects, than a metal-semiconductor Schottky junction. This avoids the occurrence of Fermi-level pinning at the interface. Still further, these embodiments present less of a barrier to hole injection than a Schottky device by introducing a large discontinuity in the valence band and by minimizing the electron density at the interface.

It has further been discovered that the performance of nanocrystals in photovoltaic devices and in optoelectronic devices in general, and particularly nanocrystals with surface anions, is enhanced by depositing cations over the nanocrystals to form a first or inner shell and depositing anions over the first shell to form a second or outer shell. The inner and outer shells together passivate surface defects on the nanocrystal which tend to disrupt the quantum confinement of the nanocrystal. Passivation is known to be achievable by the placement of short organic ligands such as ethanedithiol, butylamine, or mercaptopropionic acid on the nanocrystal surface. The use of cation and anion shells in place of these ligands offers the advantages that the cation shells bind to the anions on the nanocrystal surface rather than to the cations, as organic ligands tend to do, and the ionic bonds are stable upon exposure to air and light, and particularly moisture, oxygen, and heat. Further advantages of these cation and anion shells are that by avoiding the need for organic ligands, these shells allow the nanocrystals to reside very close to each other in the light-absorbing film and thereby promote electron wave function overlap and carrier mobility, valuable features that are typically impeded by organic ligands.

DETAILED DESCRIPTION OF ILLUSTRATIVE EMBODIMENTS OF THE INVENTION

Figure 1:
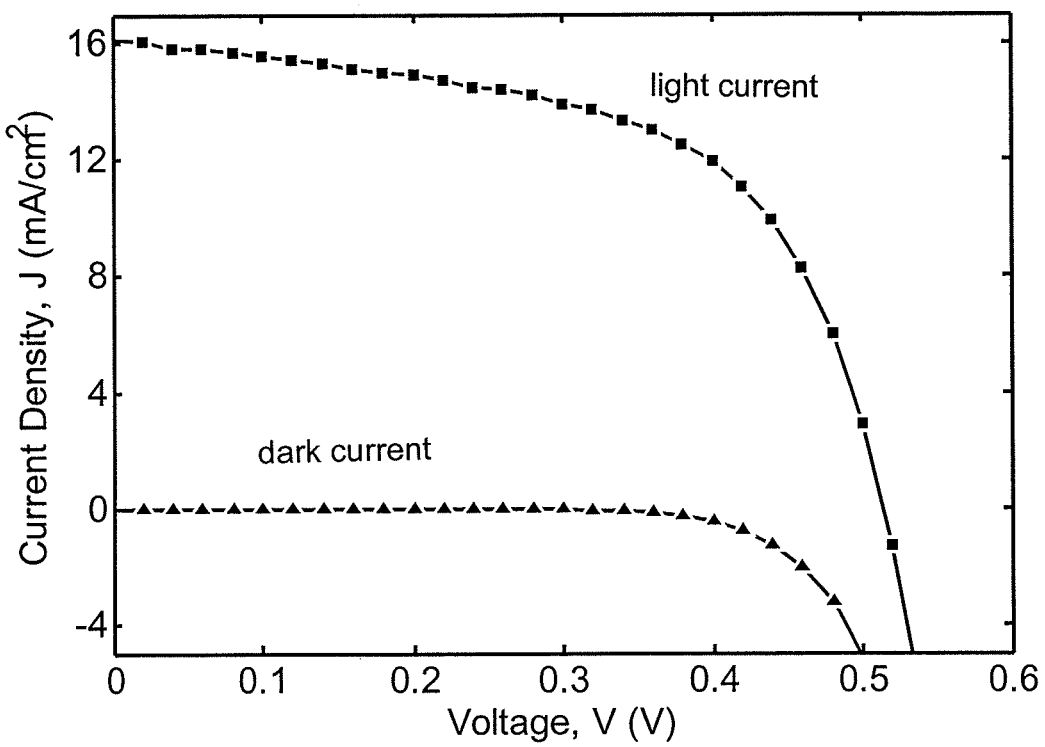
FIG. 1 is a plot of current density vs. voltage for examples of depleted heterojunction photovoltaic cells within the scope of the present invention.

The term "substantially depleted" as used herein to characterize the region(s) adjacent to a heterojunction denotes that the charge density in the region(s) is orders of magnitude less than that of the metal side of a Schottky junction. In certain heterojunction regions of the invention, the charge density is three or more orders of magnitude less than the charge density of conducting metals, and in many of these, the charge density is four or more, five or more, or six or more orders of magnitude less. Particularly effective results can be achieved when the depleted charge density is on the n-type electron accepting layer side of the junction. In many embodiments of the invention, a range of charge density in the depleted region is about $1 \times 10^{12}$ cm$^{-3}$ to about $1 \times 10^{18}$ cm$^{-3}$, or alternatively about $1 \times 10^{14}$ cm$^{-3}$ to about $1 \times 10^{17}$ cm$^{-3}$, or as a further alternative about $1 \times 10^{15}$ cm$^{-3}$ to about $1 \times 10^{16}$ cm$^{-3}$.

To achieve a depleted heterojunction by use of materials of different bandgap magnitudes on the two sides of the junction, effective results in many cases can be achieved with a bandgap difference (i.e., the difference between the bandgap magnitude on one side of the junction and the bandgap magnitude on the other side of the junction) of at least about 1.5 eV, or within the range of from about 1.5 eV to about 5 eV, or even more effectively within the range of from about 2 eV to about 5 eV. With an n-type electron-accepting layer on one side of the junction and p-type light-absorbing nanoparticles on the other, the bandgap of greater magnitude will reside in the n-type electron-accepting layer.

Quantum dots are particularly useful as the nanoparticles, and colloidal quantum dots, i.e., quantum dots manufactured by colloid chemistry, are notable examples. Of these, metal chalcogenide quantum dots are well known in the art, and lead chalcogenide, and particularly lead sulfide, quantum dots are of particular interest. Quantum dots are known to absorb light at wavelengths related to the diameters of individual quantum dots, and this property can be used in the present invention to select or optimize the light-absorbing characteristics of the quantum dots. In many cases, quantum dots with a number-average diameter within the range of about 2 nm to about 15 nm can be used effectively, while those with a number-average diameter within the range of about 3 nm to about 10 nm are often the most appropriate, and among these the range of about 3 nm to about 6 nm are often even more useful.

The n-type electron-accepting layer can vary widely in composition, provided that the combination of n-type electron-accepting layer and light-absorbing nanoparticles when placed in contact form the depleted heterojunction described above. Metal oxides are examples of materials that can serve effectively as the n-type electron-accepting layer, and a particularly useful example of a metal oxide is titanium dioxide.

In those aspects of the invention that relate to nanoparticles with inner passivating shells of cations and outer passivating shells of anions, the core of such a nanoparticle is generally a quantum dot having exposed anions at its surface. As noted above, the quantum dot core is in many cases a metal chalcogenide colloidal quantum dot, most often a metal sulfide colloidal quantum dot. A noted example is lead sulfide, and lead sulfide quantum dots are often lead rich, with a surface composed primarily of exposed $Pb^{2+}$ ions but also containing exposed $S^{2-}$ ions. The cations of the inner shell bind to, and thereby passivate, the $S^{2-}$ ions at the core surface, while the anions in the outer shell bind to, and thereby passivate, the cations of the inner shell. Examples of cations that can be used for the first shell are $Cd^{2+}$, $Pb^{2+}$, $Zn^{2+}$, and $Sn^{2+}$. Among these, $Cd^{2+}$ is particularly convenient and effective. Examples of anions effective for use as the second shell are halogen ions and the thiocyanate ion. Of these, halogen ions, and particularly bromine ion, are optimal or particularly convenient in certain cases. These dual-shelled nanoparticles are useful as the light-absorbing nanoparticles of the depleted heterojunctions described above, but are also useful in optoelectronic devices in general, i.e., any devices in which the particles serve to absorb light energy and convert the absorbed energy to an electric current.

In further aspects, therefore, the present invention resides in the formation of passivated p-type semiconductor nanoparticles without using organic ligands as passivating agents. This is achieved by treating p-type semiconductor quantum dots that have surface anions with a solution of a cation-containing reagent that passivates the surface anions, and then treating the resulting cation-treated quantum dot core with a solution of a reagent that contains anions that passivate the cations. Noting the example of $Cd^{2+}$ as a cation useful for the passivation of the quantum dot core, an example of a $Cd^{2+}$-containing reagent is cadmium(II) chloride-tetradecylphosphonic acid-oleylamine. Examples of anion-containing reagents are quaternary ammonium halides and thiocyanates, and specific examples are cetyltrimethylammonium bromide, hexatrimethylammonium chloride, tetrabutylammonium iodide, and tetrbutylammonium thiocyanate.

Photovoltaic devices utilizing one or more of the features described above will typically contain at least two electrodes, one electrically connected to each of the two semiconductor layers of the heterojunction. In a heterojunction between a n-type metal oxide layer and a layer of p-type metal chalcogenide colloidal quantum dots, for example, a first electrode will be in direct electrical contact with the n-type metal oxide layer and a second electrode will be in contact with the colloidal quantum dot layer. The first electrode in many cases is a light-transmitting electrode, and examples are aluminum oxide, zinc oxide, indium tin oxide (ITO), and fluorine-doped tin oxide (FTO). The second electrode in many cases is either nickel, lithium fluoride, platinum, palladium, silver, gold, or copper, or alloys of two or more of these metals, such as alloys of silver, gold, and copper. One example of a combination of electrode materials is fluorine-doped tin oxide as the first electrode and gold as the second electrode.

Example 1

This example illustrates the preparation of depleted heterojunction photovoltaic cells within the scope of the present invention, each formed by depositing a layer of PbS colloidal quantum dots (approximately $10^{17}$ cm$^{-3}$ n-type doping) of varying diameters—3.7 nm (bandgap 1.3 eV), 4.3 nm (bandgap 1.1 eV), and 5.5 nm (bandgap 0.9 eV)—over transparent TiO$_2$ electrodes.

The TiO$_2$ electrodes were prepared on SnO$_2$:F (FTO)-coated glass substrates (Pilkington TEC 15, Hartford Glass, Inc., Hartford City, Ind., USA) with a TiO$_2$ paste (DSL-90T, Dyesol Ltd., Queanbeyan, NSW, Australia) as follows. The FTO substrates were first rinsed with toluene, then sonicated for twenty minutes in a mixture of Triton in de-ionized water (1-3% by volume). Separately, a TiO$_2$ paste was prepared by combining one part by weight TiO$_2$ nanoparticles with three parts by weight terpineol. The paste was then spin cast at 1500 rpm for ninety seconds on the TiCl$_4$-treated FTO substrates. One edge of each substrate was then wiped free of the paste with a swab soaked in isopropyl alcohol to expose a section of clean FTO for electrical contacting. This was immediately followed by sintering for one hour on a hotplate at 400° C. The substrates were then placed in a bath of 60 mM TiCl$_4$ in de-ionized water, and baked in the bath at 70° C. for thirty minutes. They were then rinsed with de-ionized water, dried with nitrogen, and placed in a 520° C. tube furnace for one hour, then cooled to room temperature. The sample was then allowed to cool, and the TiCl$_4$ treatment was repeated, followed by a final heating to 520° C. The substrates were then placed in individual substrate holders and stored in air for up to one week prior to further processing.

PbS colloidal quantum dots were prepared as follows. Bis(trimethylsilyl)sulphide (TMS, synthesis grade) (0.18 g, 1 mol) was added to 1-octadecene (10 mL), which had been dried and degassed by heating to 80° C. under vacuum for 24 hours. A mixture of oleic acid (1.34 g, 4.8 mmol), PbO (0.45 g, 2.0 mmol), and 1-octadecene (14.2 g, 56.2 mmol) was heated to 95° C. under vacuum for sixteen hours, then placed under Ar. The flask temperature was increased to 120° C. and the TMS/octadecene mixture was injected, causing the temperature to drop to about 95° C., and the flask was allowed to cool to 36° C. The nanocrystals were precipitated with 50 mL of distilled acetone and centrifuged under ambient conditions. The supernatant was then discarded, and the precipitate was redispersed in toluene, precipitated again with 20 mL of acetone, centrifuged for five minutes, dried, and again dispersed in toluene (about 200 mg mL$^{-1}$). The nanocrystals were then placed in a N$_2$-filled glove box, where they were precipitated twice with methane and then finally redispersed at 25 or 50 mg mL$^{-1}$ in octane.

The resulting oleate-capped PbS quantum dots were deposited on the TiO$_2$ by multilayer spin-coating of the TiO$_2$ surface with 25 or 50 mg/mL solutions of the quantum dots in octane under ambient conditions. Each layer was deposited at 2500 rpm, then treated briefly with 10% 3-mercaptopropionic acid in methanol to displace the oleate ligand and thereby render the quantum dots insoluble, then rinsed with methanol and octane. Fifteen deposition cycles using the 25 mg/mL dispersion produced thermally stable layers 22 nm in thickness on the TiO$_2$ substrate, and eight deposition cycles using the 50 mg/mL dispersion also produced thermally stable layers of the same thickness. Each layered medium was then transferred to a glove box with N$_2$ atmosphere and left overnight. A gold contact was then deposited on the quantum dot layer by DC sputtering with 5 m Torr Ar pressure at a power density of 1 W cm$^{-2}$ through a shadow mask to thicknesses of 150 nm to 200 nm. Spatially-resolved X-ray elemental analyses and transmission electron microscopy were performed on a thin section sample prepared by focused-ion-beam milling, and revealed very little interpenetration of the quantum dot and TiO$_2$ layers.

FIG. 1 is a plot of the photovoltaic response of a depleted heterojunction solar cell as prepared above, expressed as current density in mA cm$^{-2}$ vs. voltage, with the lower curve representing the dark current and the upper curve representing the illuminated current of a cell fabricated with 1.3 eV-bandgap quantum dots (3.7 nm). The data was measured using a Keithley 2400 source-meter under ambient conditions. The solar spectrum at AM1.5 was simulated to within class A specifications with a Xe lamp and filters with the intensity adjusted to 100 mW cm$^{-2}$. The source intensity was measured with a Melles-Griot broadband power meter (responsive from 300 nm to 2000 nm), through a circular 0.049 cm$^2$ aperture at the position of the sample and confirmed with a calibrated solar cell. The accuracy of the power measurement was estimated to be ±7%. For the five devices having 1.3 eV-bandgap quantum dots, the average value of $V_{oc}$ was 0.53±0.02V, the average value of $J_{sc}$ was 15.4±1.4 mA cm$^{-2}$, and the average value of FF was 57±4%. The average AM1.5 power conversion efficiency η was thus 4.9±0.3%. For the highest-performing device, $V_{oc}$ was 0.52V, $J_{sc}$ was 16.4 mA cm$^{-2}$, and FF was 58%, yielding η of 5.1%.

Figure 2:
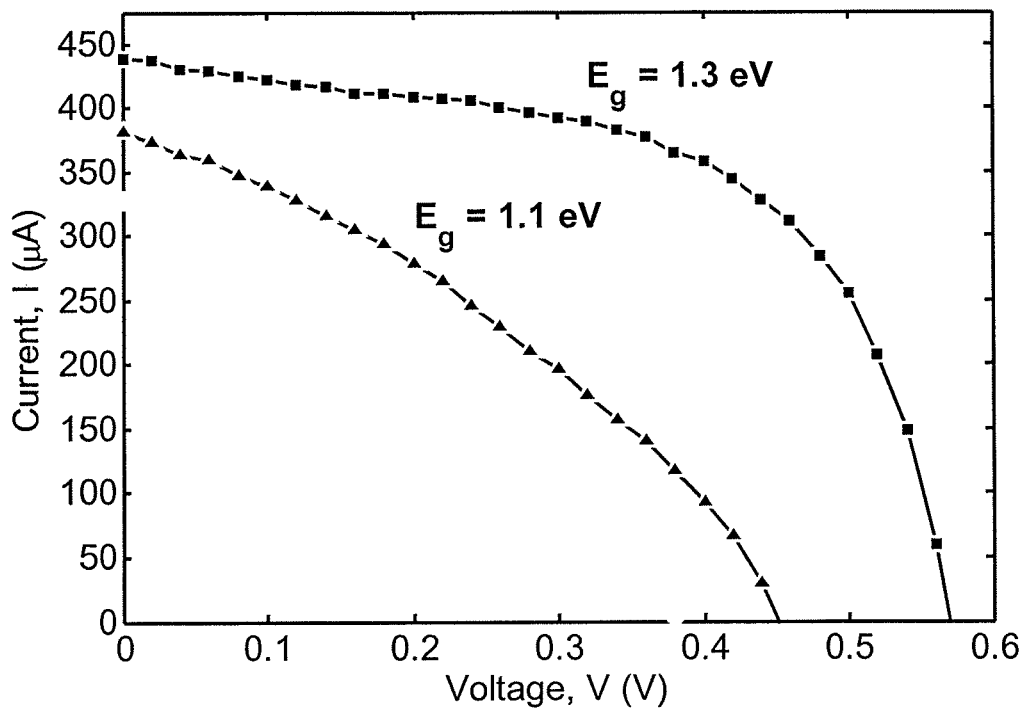
FIG. 2 is a plot of current vs. voltage for examples of depleted heterojunction photovoltaic cells within the scope of the present invention.

FIG. 2 is a plot of the photovoltaic response of a depleted heterojunction solar cell as prepared above, expressed as current in mA vs. voltage, with the lower curve representing cells fabricated with 0.9 eV-bandgap (5.5 nm) quantum dots, the middle curve representing the cells fabricated with 1.1 eV-bandgap (4.3 nm) quantum dots, and the upper curve representing the cells fabricated with 1.3 eV-bandgap (3.7 nm) quantum dots. This figure shows that the largest quantum dots had the smallest driving force for electron transfer in TiO$_2$, and yet devices with these 0.9 eV bandgaps still showed a short-circuit current density $J_{sc}$ above 10 mA/cm$^2$ and an open-circuit voltage $V_{oc}$ of 0.38V. This indicates that minimal band offset is required for efficient electron transfer from the PbS colloidal quantum dots into the TiO$_2$ electrode.

This is in contrast to organic photovoltaics, which have a large band offset between the electron donor and acceptor, the large band offset imposing a substantial penalty on efficiency.

Figure 3:
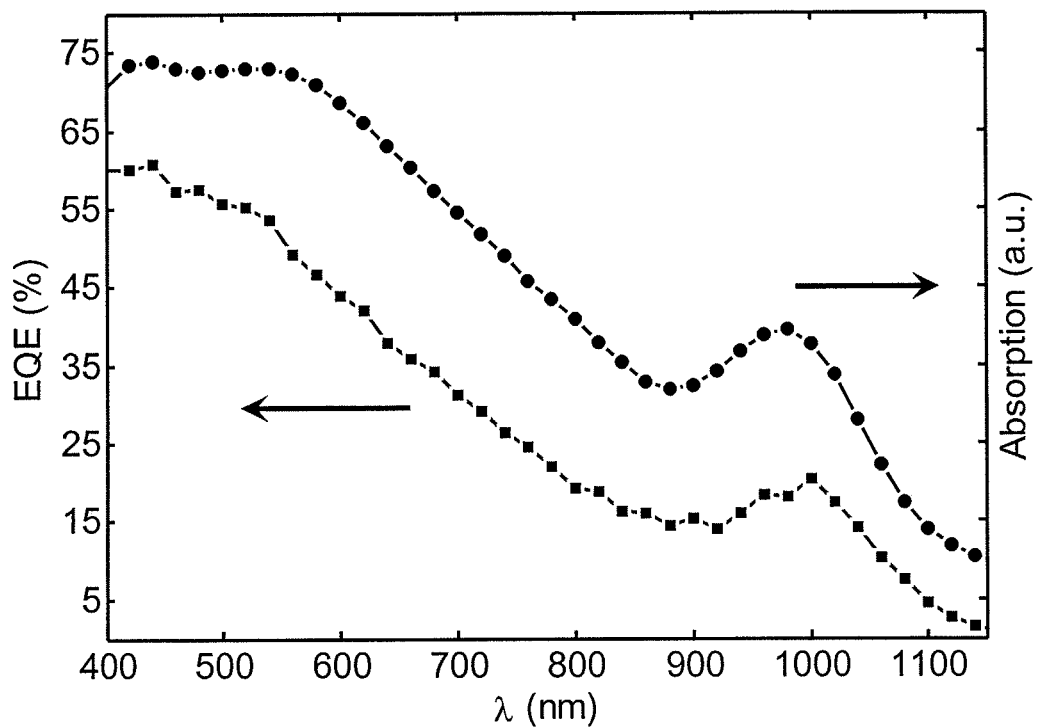
FIG. 3 is a plot of external quantum efficiency vs. wavelength for examples of depleted heterojunction photovoltaic cells within the scope of the present invention.

FIG. 3 is a plot of external quantum efficiency (EQE) vs. wavelength and of absorption vs. wavelength, with the lower curve representing the EQE for the best-performing 1.3 eV-bandgap quantum dot device and the upper curve representing the spectral absorption of the same device. The EQE is the ratio of extracted electrons to incident photons and the curve is also known as the incident photon conversion efficiency spectrum. The EQE was obtained by passing the output of a 400W Xe lamp through a monochromator and using appropriate order-sorting filters. The collimated output of the monochromator was measured through a 1.5 nm aperture with a calibrated Newport 818-UV power meter. The measurement bandwidth was about 40 nm and the intensity varied with the spectrum of the Xe lamp. The average intensity was 0.3 mW cm$^{-2}$. The current-voltage response was measured with Keithley 2400 source-meters. The plot shows that at short wavelengths, the EQE reached values above 60%, while at longer wavelengths the EQE had a peak of 24%.

Figure 4:
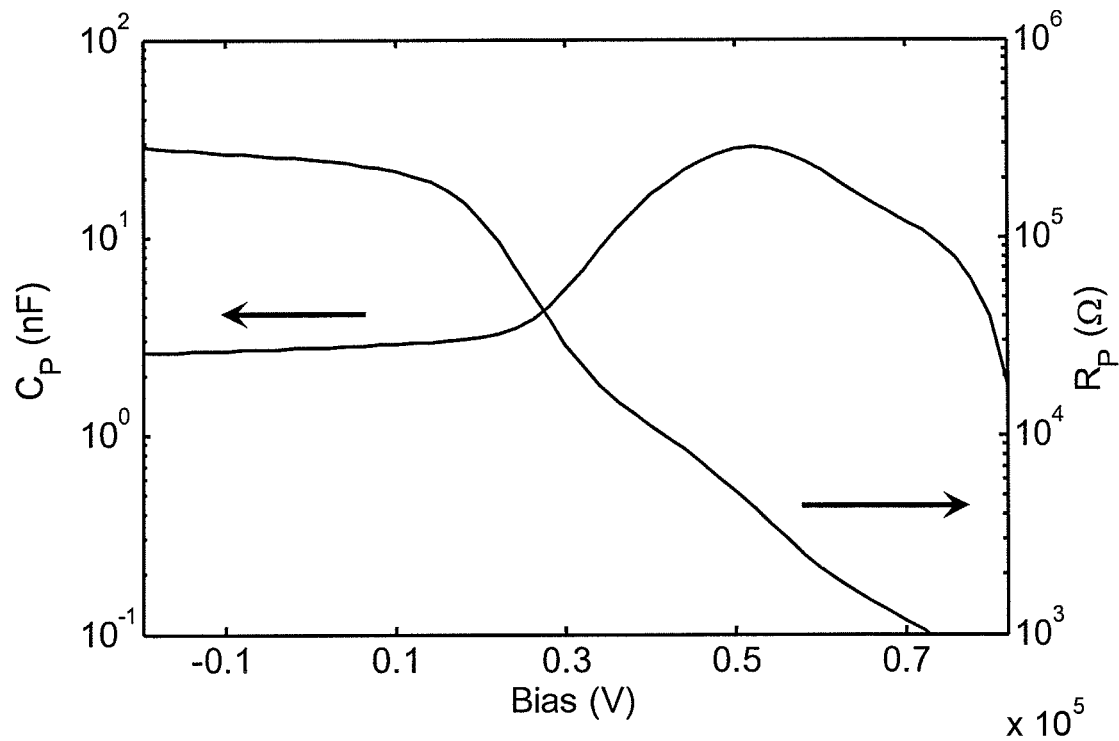
FIG. 4 is a plot of device capacitance vs. bias voltage and device resistance vs. bias voltage for examples of depleted heterojunction photovoltaic cells within the scope of the present invention.

FIG. 4 is a plot of device capacitance vs. bias voltage and of device resistance vs. bias voltage. The capacitance arises from the depletion layer due to charge transfer from TiO$_2$ to the PbS colloidal quantum dot layer. Capacitance-voltage measurements were performed directly on the photovoltaic devices using an Agilent 4284A LCR meter. Absorption spectroscopy was performed on a Cary 500 UV-vis-IR Scan photospectrometer. The impedance was acquired at 2 kHz with a signal amplitude of 10 mV, and is represented in FIG. 4 in terms of equivalent parallel resistance $R_p$ and capacitance $C_p$ for a device with a contact area of 0.03 cm$^3$. The plot shows that the capacitance, and its associated depletion layer distributed between the two semiconductors, persist up to a bias of 0.6V, close to the observed open-circuit voltage value. This is a direct indication of the presence of a built-in field that efficiently drives the separation of photogenerated carriers.

Example 2

This example illustrates the preparation and use of nanoparticles containing a quantum dot core, an inner shell of cations and an outer shell of anions, within the scope of the present invention.

Colloidal quantum dots capped with oleic acid ligands were synthesized and stripped of their oleate ligands, in the manner described in Example 1. These quantum dots were prepared with an excess of Pb during synthesis, resulting in a lead-rich bulk composition but with sulfur atoms on their surfaces, either from nonpolar {100} and {110} or polar {111} facets in their crystal structure. To form the inner shell of Cd cations over these PbS cores, the nanoparticles were treated with a solution of CdCl$_2$-tetradecylphosphonic acid-oleylamine (CdCl$_2$-TDPA-OLA). This treatment resulted in a slight redshift (between 6 and 24 nm) of the excitonic absorption, suggesting growth of a partial monolayer of highly cation-rich material on the surface, an interpretation reinforced by the approximately 30 nm blueshift observed when a control treatment involving TDPA-OLA only (no CdCl$_2$) was implemented. Elemental analysis and X-ray photoelectron microscopy both indicated 0.3% atomic ratio of cadmium to other elements present in powders of the resultant samples. X-ray diffraction indicated that no purely Cd-based phase (such as CdS) was present.

An outer shell of bromine ions was then applied by the use of a solution of cetyltrimethylammonium bromide in methanol. The cetyltrimethylammonium cations combined with any remaining oleates on the particles to form salts that were then removed with a final methanol rinse. The cetyltrimethylammonium bromide treatment and methanol rinse were conducted in air at room temperature (23° C.), including the absence of hydrazine. The absence of any appreciable amounts of organics at the outer surfaces of the treated particles was confirmed by FTIR spectra showing a complete absence of C-H vibrations at 2922 cm$^{-1}$ and 2852 cm$^{-1}$. The presence of a significant amount of bromide in the outer applied film was confirmed by X-ray photoelectron spectroscopy (XPS) and energy-dispersive X-ray spectroscopy (EDX), and simple calculation indicated an approximate 1:1 ratio of bromide ions to surface cations. Elemental analysis confirmed that the 0.3% of Cd cations present following the initial CdCl$_2$-TDPA-OLA were still present after application of the bromide shell.

Figure 5:
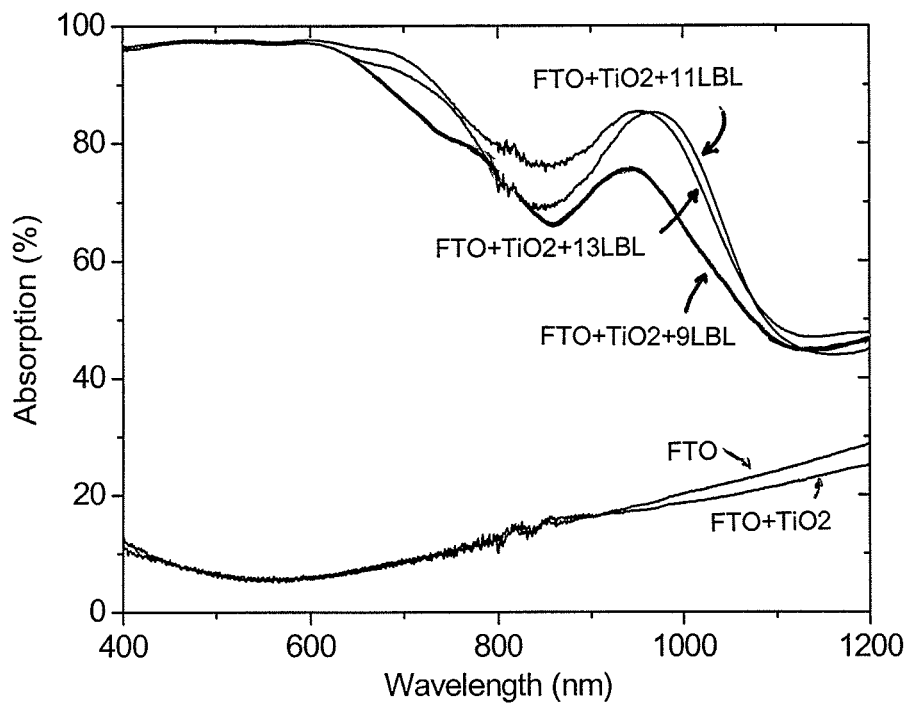
FIG. 5 shows absorption spectra of examples of depleted heterojunction photovoltaic cells with dual-shell-passivated quantum dots within the scope of the present invention.

Photovoltaic devices utilizing these dual-shell-passivated quantum dots were fabricated in the same manner as described in Example 1 above. A scanning electron micrograph showed that the quantum dot layer was approximately 300 nm in thickness and was free of the voids and cracks that often occur in films made from layer-by-layer deposition. Absorption spectra of the devices were obtained in a double pass by including reflection from the Au top contact. The spectra of devices made using 9, 11, and 13 quantum dot layers are shown in FIG. 5, which also includes corresponding spectra from the bare FTO/TiO$_2$ substrate. The absorption peak at 950 nm is the excitonic peak of the PbS quantum dots. This indicates that quantum confinement of the core quantum dots was preserved in the shelled form. A reduction in interparticle distance is suggested by the red-shift (−100 meV) of the excitonic peak in the final film as compared to the excitonic peak of dots in solution. Upon exposure to 100 mW/cm$^2$ solar illumination, the device showed an open circuit voltage ($V_{oc}$) of 0.45V, a short-circuit current density ($J_{sc}$) of 21.8 mA/cm$^2$, and a fill factor (FF) of 59%, yielding a power conversion efficiency η of 5.76%. Integration of the net absorption of the quantum dot film over the AM1.5G spectrum indicates that a film having 100% quantum efficiency would have achieved a circuit current density ($J_{sc}$) of 24.4 mA/cm$^2$. Comparing this with the measured circuit current density ($J_{sc}$) of 21.8 mA/cm$^2$ indicates that the internal quantum efficiency (IQE) averaged across the entire broadband absorbing region of 400-1150 nm exceeds 90%, indicating minimal recombination loss and efficient carrier extraction.

Figure 6:
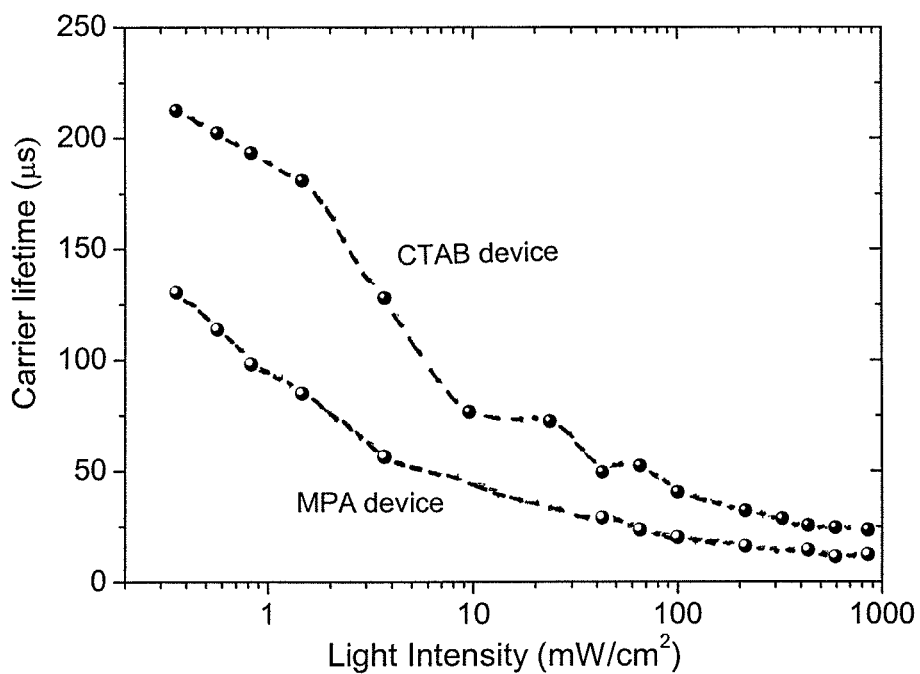
FIG. 6 is a plot of carrier lifetime vs. light intensity for examples of depleted heterojunction photovoltaic cells with dual-shell-passivated quantum dots within the scope of the present invention.

The doping density and carrier lifetime of the dual-shell-passivated quantum dot films were determined by capacitance-voltage (C-V) and $V_{oc}$ decay analyses, respectively. The C-V analysis showed that doping was a full order of magnitude lower than in the lowest-doped organic ligand PbS and PbSe quantum dot films, and the carrier lifetime τ, which is shown in FIG. 6, was approximately twice as long as that of a control device made using a bidentate organic ligand (3-mercaptopropionic acid, also shown in FIG. 6), reaching a remarkably long lifetime of over 40 μsec even under full solar 100 mW/cm$^2$ illumination.

Figure 7:
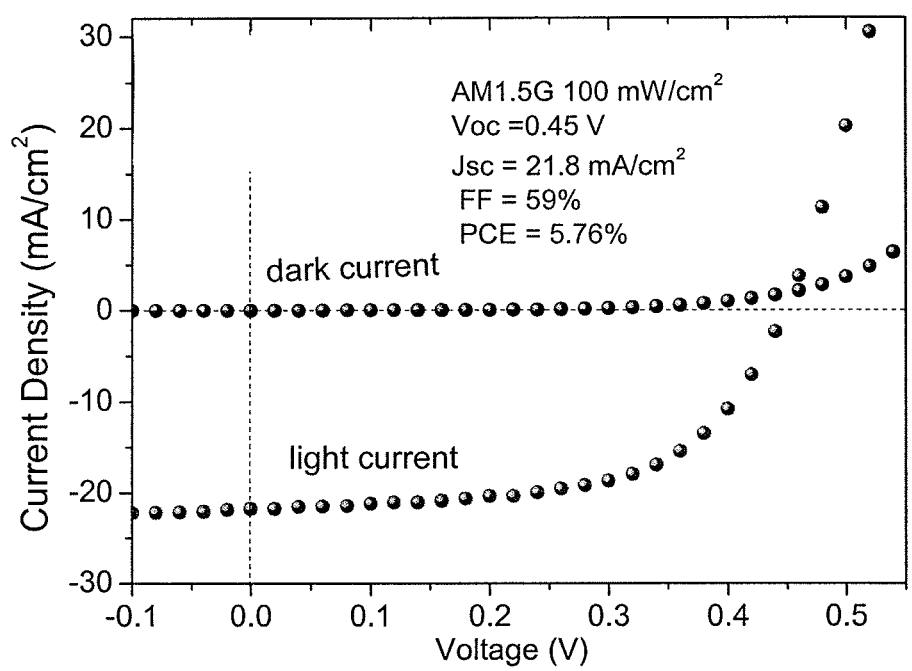
FIG. 7 is a plot of current density vs. voltage for examples of depleted heterojunction photovoltaic cells with dual-shell-passivated quantum dots within the scope of the present invention.

The dual-shell-passivated quantum dots also demonstrated an improved resistance to oxidation. FIG. 7 is a plot of current density vs. voltage, comparing a layer of dual-shell-passivated quantum dots in accordance with the invention with quantum dots bearing 3-mercaptopropionic acid ligands, each shown both fresh (immediately after fabrication) and after ten days of storage under ambient conditions on a laboratory bench. The dual-shell-passivated quantum dots showed no significant change in performance over the ten-day period, while the organic ligand-capped quantum dots underwent a complete loss of efficiency over the same period.

To demonstrate the effectiveness of inner shells of anions other than bromide ions, devices were made containing dual-shell-passivated quantum dots with a variety of anions, and measurements of the photovoltaic performance characteristics were made. The anion-bearing reagents were hexatrimethylammonium chloride (HTAC), cetyltrimethylammonium bromide (CTAB), tetrabutylammonium iodide (TBAI), and tetrabutylammonium thiocyanate (TBAT). The parameters measured were $J_{sc}$ in mA/cm$^2$, $V_{oc}$ in V, FF in %, $\eta$ in %, shunt resistance $R_{sh}$ and series resistance $R_s$, and rectification (the current between forward bias +1V and reverse bias −1V), and are listed in the following Table.

| Reagent | Ligand | $J_{sc}$ | $V_{oc}$ | FF | $\eta$ | $R_{sh}$ | $R_s$ | Rectification |
|---|---|---|---|---|---|---|---|---|
| HTAC | Cl⁻ | 17.1 | 0.43 | 55% | 4.08% | 3388 | 1112 | 10391 |
| CTAB | Br⁻ | 21.8 | 0.35 | 59% | 5.76% | 3351 | 60 | 2920 |
| TBAI | I⁻ | 20.2 | 0.43 | 43% | 3.76% | 3195 | 148 | 4916 |
| TBAT | SCN⁻ | 13.9 | 0.43 | 30% | 1.72% | 1924 | 847 | 4232 |

In the claims appended hereto, the term "a" or "an" is intended to mean "one or more." The term "comprise" and variations thereof such as "comprises" and "comprising," when preceding the recitation of a step or an element, are intended to mean that the addition of further steps or elements is optional and not excluded. All patents, patent applications, and other published reference materials cited in this specification are hereby incorporated herein by reference in their entirety. Any discrepancy between any reference material cited herein or any prior art in general and an explicit teaching of this specification is intended to be resolved in favor of the teaching in this specification. This includes any discrepancy between an art-understood definition of a word or phrase and a definition explicitly provided in this specification of the same word or phrase.

What is claimed is:

1. A nanoparticle comprising:
   a quantum dot core comprising a single quantum dot and surface anions;
   an inner shell comprising cations that are bound to the surface anions of the quantum dot core; and
   an outer shell comprising anions that are bound to the cations of the inner shell,
   wherein the nanoparticle is not passivated by organic ligands; and
   wherein the anions of the outer shell are a member selected from the group consisting of halogen ions and thiocyanate ion.

2. The nanoparticle of claim 1, wherein the quantum dot core is a metal chalcogenide colloidal quantum dot.

3. The nanoparticle of claim 1, wherein the quantum dot core is a metal sulfide colloidal quantum dot.

4. The nanoparticle of claim 1, wherein the quantum dot core is a metal sulfide colloidal quantum dot and the cations of the inner shell are a member selected from the group consisting of $Cd^{2+}$, $Pb^{2+}$, $Zn^{2+}$, and $Sn^{2+}$.

5. The nanoparticle of claim 1, wherein the quantum dot core is a metal sulfide colloidal quantum dot and the cations of the inner shell are $Cd^{2+}$.

6. The nanoparticle of claim 1, wherein the quantum dot core is a metal sulfide colloidal quantum dot, the cations of the inner shell are $Cd^{2+}$, and the anions of the outer shell are halogen ions.

7. The nanoparticle of claim 1, wherein the quantum dot core is a metal sulfide colloidal quantum dot, the cations of the inner shell are $Cd^{2+}$, and the anions of the outer shell are bromine ions.

8. A photoelectric device comprising:
   a light-transmitting first electrode;
   a first semiconductor layer in direct electrical contact with the first electrode;
   a second semiconductor layer in direct electrical contact with the first semiconductor layer and comprising light-absorbing nanoparticles, wherein each of the nanoparticles comprises a quantum dot core comprising a single quantum dot and surface anions, a first shell comprising cations bound to the surface anions of the quantum dot core, and a second shell comprising anions bound to the cations, wherein the nanoparticles are not passivated by organic ligands, and wherein the anions of the second shell are a member selected from the group consisting of halogen ions and thiocyanate ion; and
   a second electrode in direct electrical contact with the second semiconductor layer.

9. The photoelectric device of claim 8, wherein the quantum dot core is a metal sulfide colloidal quantum dot and the cations of the first shell are $Cd^{2+}$.

10. The photoelectric device of claim 8, wherein the cations of the first shell are $Cd^{2+}$.

11. The photoelectric device of claim 8, wherein the quantum dot core is a metal sulfide colloidal quantum dot, the cations of the first shell are $Cd^{2+}$, and the anions of the second shell are halogen ions.

12. The photoelectric device of claim 8, wherein the quantum dot core is a metal sulfide colloidal quantum dot, the cations of the first shell are $Cd^{2+}$, and the anions of the second shell are bromine ions.

13. The photoelectric device of claim 8, wherein the first semiconductor layer and the nanoparticles form a photovoltaic junction therebetween, at least one side of which is substantially depleted of free electrons and of free holes when the device is not illuminated.

14. A method of forming passivated p-type semiconductor nanoparticles, the method comprising:
   treating p-type semiconductor colloidal quantum dots having surface anions with a solution of a cation-containing reagent that passivates the surface anions to form colloidal quantum dots coated with the cations, and
   treating the colloidal quantum dots with a solution of an anion-containing reagent that passivates the cations,
   wherein the forming passivated p-type semiconductor nanoparticles are not passivated by organic ligands; and
   wherein the anion of the anion-containing reagent is a member selected from the group consisting of halogen ions and thiocyanate ion.

15. The method of claim 14, wherein the p-type semiconductor colloidal quantum dots are metal chalcogenide colloidal quantum dots, metal sulfide colloidal quantum dots, or lead sulfide colloidal quantum dots.

16. The method of claim 14, wherein the cation of the cation-containing reagent is a member selected from the group consisting of $Cd^{2+}$, $Pb^{2+}$, $Zn^{2+}$, and $Sn^{2+}$.

17. The method of claim 14, wherein the anion of the anion-containing reagent is a bromine ion.

18. The method of claim 14, wherein the anion-containing reagent is a member selected from the group consisting of cetyltrimethylammonium bromide, hexatrimethylammonium chloride, tetrabutylammonium iodide, and tetrabutylammonium thiocyanate.

* * * * *